United States Patent [19]

Kotval et al.

[11] 4,124,410
[45] Nov. 7, 1978

[54] SILICON SOLAR CELLS WITH LOW-COST SUBSTRATES

[75] Inventors: Peshotan S. Kotval, Hartsdale; Harold B. Strock, North Tarrytown, both of N.Y.

[73] Assignee: Union Carbide Corporation, New York, N.Y.

[21] Appl. No.: 853,770

[22] Filed: Nov. 21, 1977

[51] Int. Cl.$^2$ ............................................. H01L 31/06
[52] U.S. Cl. ................. 136/89 TF; 75/134 S; 148/174; 148/175; 148/186; 156/616 R; 156/617 SP; 136/89 SG; 357/7; 357/30; 357/59; 423/350
[58] Field of Search ...................... 136/89 SG, 89 TF; 357/30, 59, 7; 148/174, 175, 186; 423/348–350; 75/134 S; 156/616, 617; 29/572

[56] References Cited

U.S. PATENT DOCUMENTS

| 2,797,988 | 7/1957 | Barker, Jr. ................................ 75/13 |
| 3,097,068 | 7/1963 | Litz et al. ............................... 423/348 |
| 3,871,872 | 3/1975 | Downing et al. ........................... 75/61 |
| 3,933,981 | 1/1976 | Wakefield et al. ..................... 423/348 |
| 3,961,997 | 6/1976 | Chu ........................................ 148/174 |
| 4,001,864 | 1/1977 | Gibbons ................................... 357/30 |

FOREIGN PATENT DOCUMENTS 1,167,320  4/1964  Fed. Rep. of Germany ........... 423/350

OTHER PUBLICATIONS

T. L. Chu, "Reducing Grain–Boundary Effects In Polycrystalline Silicon Solar Cells", *Appl. Phys. Lett.,* vol. 29, pp. 675–676 (1976).
T. L. Chu et al., "Silicon Solar Cells On metallurgical Silicon Substrates", *Conf. Record,* 12th IEEE Photovoltaic Specialists Conf., pp. 74–76, Nov. 1976.
T. L. Chu et al., "Silicon Solar Cells On Unidirectionally Recystallized Metallurgical Silicon", *IEEE Trans Electron Devices,* vol. Ed–24, pp. 442–446, (1977).

*Primary Examiner*—John H. Mack
*Assistant Examiner*—Aaron Weisstuch
*Attorney, Agent, or Firm*—Alvin H. Fritschler

[57] ABSTRACT

Epitaxial and diffusion-type planar diodes and solar cells utilize low-cost refined metallurgical silicon substrates having a substantially higher impurity content than conventional high-cost, high purity semiconductor grade silicon. The epitaxial type products have an n-on-p-on-p substrate configuration, while the diffusion-type products have pentavalent impurities diffused therein to form a p-n junction in the low cost silicon substrate. One embodiment employs a multigrained refined metallurgical silicon (RMS) prepared by precipitating essentially iron-free silicon platelets from a solution of metallurgical grade silicon in molten aluminum, melting said refined platelets, in contact with a silica slag and pulling silicon boules from a melt of said refined metallurgical silicon (RMS). By directionally solidifying the refined silicon-slag melt, a multigrained, directionally solidified refined metallurgical silicon (DS/RMS) is obtained, with boules being pulled from a melt thereof for use as said low-cost substrate. The DS/RMS may also be re-melted and directionally solidified a second time with the boules being pulled from said twice directionally-solidified material being a desirable, low-cost, single crystal material suitable for use as said substrate for planar diode and solar cell applications.

58 Claims, No Drawings

SILICON SOLAR CELLS WITH LOW-COST SUBSTRATES

BACKGROUND OF THE INVENTION

1. Field of the Invention

This invention relates to planar diode and solar cell products. More particularly, it relates to such products made from low-cost refined metallurgical silicon.

2. Description of the Prior Art

The development of new techniques and products for the low-cost utilization of non-polluting sources of energy is of paramount national and world-wide interest. Solar energy is among the energy sources of greatest interest because of its non-polluting nature and of its abundant, non-diminishing availability. Two separate approaches have been utilized in efforts to develop solar energy as a suitable energy source for satisfying significant portions of the ever-increasing energy requirements of modern, industrial societies. In one approach, solar energy is converted into thermal energy, while the second approach involves the conversion of solar energy into electricity by means of the photovoltaic effect upon the absorption of sunlight by so-called solar cells. The present invention relates to the second approach and to the development of low-cost silicon materials for use in such solar cells.

Silicon solar cells, the most commonly employed devices based on said photovoltaic effect, have been employed reliably in space craft applications for many years. For such applications and for industrial and commercial applications in general, crystals of high purity, semiconductor grade silicon are commonly utilized. Such high purity, high perfection silicon is prepared by rather costly procedures involving converting metallurgical grade silicon to trichlorosilane, which is then reduced to produce polycrystalline, semiconductor grade silicon from which single crystals can be grown. The costs associated with the production of such high purity, high perfection crystals are high. For example, polycrystalline semiconductor grade silicon made from metallurgical grade silicon costing about $0.50/lb. will presently cost on the order of about $30/lb. and up. A single crystal is grown from this semiconductor grade material, the ends of the single crystal ingot or boule are cut off, and the boule is sawed, etched and polished to produce polished wafers for solar cell application, with mechanical breakage and electronic imperfection reducing the amount of useable material obtained. As a result of such processing, less than 20% of the original polycrystalline, semiconductor grade silicon will generally be recovered in the form of useable wafers of single crystal material. The overall cost of such useable material is, accordingly, presently on the order of about $300/lb. and up. Because of the relatively large area requirements involved in solar cell applications, such material costs are a significant factor in the overall economics of such applications.

The economic feasibility of utilizing solar cell technology for significant portions of the present and prospective needs for replenishable, non-polluting energy sources would be enhanced, therefore, if the utilization of high cost, high purity, high perfection single crystal wafers could be avoided. Previous efforts to refine metallurgical silicon for other applications, however, have not resulted in the production of materials that can be utilized in solar cells although the electronic characteristics of various grades of silicons for solar cells are less stringent than, for example, such silicons as employed for complex circuitry in the electronics industry.

Metallurgical silicon has heretofore been refined by slag oxidation to obtain a grade of metallurgical silicon or ferrosilicon advantageous as an alloying additive in the manufacturing of steels. As indicated in the Barber et al patent, U.S. Pat. No. 2,797,988, and elsewhere, the slag oxidation approach has been utilized to remove impurities and thus to purify and refine silicon having an iron content therein such that the refined product constitutes a ferrosilicon in which iron is considered an integral part of the final refined product. For use of silicon as a substrate in planar diodes and solar cells made therefrom, however, it is necessary that the refined silicon have as low an iron content as possible, as such iron is a deleterious impurity in a solar cell material. As indicated above, this circumstance is in contradistinction to the benign nature of the iron content of the refined silicon product as utilized in the steel industry.

Silicon has also been purified heretofore by the dissolution and subsequent precipitation of silicon from a liquid metal system. Such purification, taught by Litz, U.S. Pat. No. 3,097,068 and Wakefield, U.S. Pat. No. 3,933,981, involve the retention of silicon impurities by the liquid metal solvent when dissolution takes place at a higher temperature and, subsequently, the temperature is lowered to precipitate a relatively pure silicon. Such a silicon product is not suitable for use as a substrate in solar cell applications, however, since the liquid metal of the solvent phase is present as an impurity in the product silicon so obtained in this processing technique.

While Litz states that the product of such refining by liquid metal solvent is too impure for use in transistors, use for rectifiers and solar batteries is indicated. The product, however, is said to contain 200 to 700 ppm of aluminum, with no mention of its iron content. Such a level of aluminum would render the product purified by the Litz technique unsuitable for solar cell application. Litz also discloses a further lengthy and expensive procedure using silicon tetrachloride to reduce the aluminum content to 9 ppm.

Other efforts to develop acceptable solar cell materials have likewise resulted either in high cost, or high impurity levels such that acceptable efficiencies can not be obtained, or a combination of these disadvantages. An acceptable efficiency for a low-cost, relatively impure silicon would, of course, very likely represent some loss from the high purity single crystal material made from semiconductor grade silicon. Such high-cost material is capable of providing efficiencies of about 13–14%. The lower cost of relatively impure silicon material, particularly multigrained material, might well constitute an advantageous trade-off enhancing the overall technical-economic feasibility of utilizing silicon solar cell technology in significant commercial operations.

The practical lower limit for economic solar cell efficiencies is about 7–8%. One attempt to produce an acceptable low-cost material has involved the pulling of ribbons from a melt of metallurgical grade silicon by known techniques. While such ribbons pulled from semiconductor grade material have obtained efficiencies of up to 10%, the ribbon pulled from metallurgical silicon is relatively dirty and impure, with solar cell efficiencies obtained from such ribbon being limited to about 5%.

Another approach has involved the pulling of boules, in a multiple series of refining steps, from metallurgical grade silicon as a starting material by the known Czochralski-pulling technique. By re-melting and re-pulling refined, multigrained silicon in a several stage process, a single crystal refined silicon is ultimately obtained that is capable of achieving efficiencies of about 8%. The cost of such material, however, is relatively high because of the multiple pulling steps involved.

Chu, U.S. Pat. No. 3,961,997, discloses the fabrication of low-cost solar cell substrates from metallurgical grade, polycrystalline silicon. In this approach, successive layers of polycrystalline silicon containing appropriate dopants are deposited over substrates of metallurgical grade silicon, graphite or steel coated with particular diffusion barrier materials. The resulting products contain a high level of impurities such that efficiencies obtainable by modifications of this approach have not exceeded about 3-5%.

A genuine need thus exists for low-cost, relatively impure silicon products suitable for use in solar cells of acceptable efficiency. The resulting low-cost solar cells should preferably have efficiencies in excess of about 10%, with 7-8% representing a practical lower limit of efficiency as indicated above.

It is an object of this invention, therefore, to provide low-cost refined metallurgical silicon products suitable for solar cell applications.

It is another object of the invention to provide refined metallurgical silicon of a relatively impure nature as compared with semiconductor grade material while having useful properties for said solar cell applications.

It is a further object of the invention to provide multigrained refined metallurgical silicon useful for solar cell applications or readily convertible to such useful silicon material.

With these and other objects in mind, the invention is hereinafter described, the novel features thereof being particularly pointed out in the appended claims.

SUMMARY OF THE INVENTION

The objects of the invention are accomplished by epitaxial and diffusion-type planar diodes and solar cells having silicon substrates, both multigrained and single crystal, prepared by the slag oxidation of partially purified silicon platelets and further treated to obtain low-cost refined metallurgical silicon having suitable properties for desirable solar cell applications. The partially purified platelets are obtained by the precipitation thereof from a solution of metallurgical grade silicon in a molten liquid solvent, such as aluminum, with treatment to remove adherent impurities therefrom. Multigrained refined metallurgical silicon (RMS) boules useful for said substrates, can be pulled by the Czochralski method from a melt of the refined silicon following said slag oxidation. By unidirectional solidification of the refined silicon-slag melt following slag oxidation, a multigrained, directionally solidified refined metallurgical silicon (DS/RMS) is obtained and is also suitable for such solar cell applications. Multigrained, DS/RMS boules pulled from a melt of said DS/RMS constitute another useful refined silicon material suitable for solar cell substrate purposes. By re-melting and re-directionally solidifying said DS/RMS, a further, single crystal product useful as said planar diode and solar cell substrate can be obtained by pulling DS/RMS boules from a melt of said twice directionally solidified material. The substrates from all of such materials, and the overall planar diode and solar cell products, are low-cost products having desirable solar cell properties. While the multigrained RMS and DS/RMS, and the single crystal DS/RMS, materials thus utilized as solar cell substrates have a substantially higher impurity content level than in conventional high purity semiconductor grade material, the materials are nevertheless of sufficient purity to permit their utilization as useful solar cell substrates. The epitaxial type solar cell products have an n-on-p-on p substrate configuration, while the diffusion-type products have pentavalent impurities diffused in the low-cost substrates to form a p-n junction therein.

DETAILED DESCRIPTION OF THE INVENTION

The present invention provides a low-cost alternative to the utilization of semiconductor grade material in the development and application of solar cell technology. While high-cost, high-purity, high-perfection single crystal silicon wafers are undoubtedly of value for specialized solar cell applications, the necessity for achieving a more commercially feasible cost structure is a major factor in the growth and development of solar cell technology for general industrial and commercial applications. As noted above, the large area requirements of solar cells, which are, in effect, simple large area planar diodes, render material costs a significant factor in the economic feasibility of solar cells vis-a-vis other presently available energy sources. By means of the present invention, practical, large-scale solar cells can be made from grades of silicon having substantially higher impurity levels than in the extremely high purity semiconductor grade silicon heretofor employed for solar cell purposes.

Semiconductor grade silicon from which high-cost, high-purity single crystals are grown generally has a resistivity, measured as a manifestation of uncompensated charge carriers, of from 1 to 10 ohm-cm or higher, with the resulting single crystal wafers prior to junction formation having resistivities of on the order of 50 to 200 ohm-cm. The present invention, on the other hand, utilizes low-cost refined metallurgical products having resistivities in the range of from about 0.04 to about 0.2 ohm-cm. While high-cost, high-purity single crystal wafers have very low impurity levels for each impurity element that are beyond the limits of detection by normal chemical analytical procedures and are manifest by resistivity measurements, the low-cost refined metallurgical products of the present invention can have significantly higher impurity levels for various of said significant impurity elements while, nevertheless, having sufficient overall purity to serve as a practical solar cell substrate having a p-n junction grown on, or diffused therein, by known epitaxial or diffusion methods.

In the practice of the present invention, metallurgical grade silicon is refined but without conversion to semiconductor grade material. Metallurgical grade silicon, as referred to herein, is a grade of silicon having a resistivity on the order of 0.005 ohm-cm and up to 3% iron, up to 0.75% aluminum, up to 0.5% calcium and other impurities normally found in silicon produced by the carbothermic reduction of silica. It is also within the scope of the invention to employ a ferro-silicon material containing at least about 90% Si and up to 10% or more of iron. Such metallurgical grade silicon or ferrosilicon is processed, for purposes of the present invention, by solvent refining to reduce the iron content and other impurities after which the partially purified silicon is melted in contact with acid silica slag with the resultant slag oxidation producing a refined metallurgical silicon (RMS) from which other products useful in solar cell applications are produced as described herein.

In the initial iron removal step, silicon platelets essentially free of iron are removed from a solution of metallurgical grade silicon in a liquid metal solvent. While such metals as tin, zinc and silver may be employed, aluminum is the preferred solvent for use in the practice of the present invention. It will be understood that the term "aluminum" is intended to cover aluminum and alloys of aluminum. Primary ingots of 99.5% to 99.9% purity and above may be used, with 99.9% nominal purity primary aluminum ingot being preferred. Aluminum alloys are also generally suitable for purposes of the invention. One such alloy that has been used contains 1% silicon and iron, 0.2% copper, 0.05% manganese and 0.1% zinc. Another such alloy contains 0.21% iron, 3% copper, 0.025% manganese, 0.88% magnesium and 0.2% chromium. The solvent purity decreases, of course, with increasing cycles of fresh silicon charge dissolution therein.

The temperature and aluminum (or other metal)/silicon ratio limits used in dissolving the metallurgical grade silicon are determined by the metal-silicon binary phase diagram. Employing aluminum as the metal solvent, silicon must be removed by cooling the liquid solution of silicon in molten aluminum to a temperature not below the eutectic temperature of about 577° C., thus forming a hypereutectic aluminum-silicon solution and causing silicon platelets to precipitate therefrom. At the eutectic temperature, 11.7% silicon is dissolved in aluminum. A homogeneous solution is formed at the high temperature dissolution point with up to 80% silicon in aluminum, preferably between 55% silicon at 1100° C. and 20% silicon at about 700° C., although temperatures closer to 600° C. may be feasible depending on the precision of the silicon-aluminum separation procedures employed. While silicon will commonly be added to molten aluminum or other liquid metal solvent, it is within the scope of the invention to add aluminum or other metal to molten silicon.

In cooling the solution, rapid cooling rates produce smaller precipitated silicon platelets than more costly, slower cooling rates. The solution should preferably be cooled at the fastest rate that will produce platelets of acceptable purity and size. Platelets of ¼ inch or larger, suitable for ready separation from the silicon-aluminum melt by filtration, have been obtained at a cooling rate of 60° C./hour, with no advantage having been obtained at slower cooling rates down to 20° C./hour. The upper range of such cooling rates will likely depend on the geometry of the particular apparatus employed and will likely be in the order of about 200° C./hour, with heat transfer limitations possibly dictating the fastest cooling rates possible for larger melts.

The solvent refining step of the invention may be carried out in any crucible that does not react with and/or contaminate the silicon-solvent metal alloy melt. Carbon or graphite crucibles are preferred but other non-reactive materials, such as refractory oxides, can also be employed. A non-oxidizing atmosphere, such as nitrogen, agron, helium or hydrogen-carbon monoxide mixtures can be employed to maximize the life of the crucible and related heating elements. While mechanical or other stirring is optional after the refined metallurgical silicon and metal solvent have been mixed, it is desirable to continue stirring during silicon dissolution, but stirring may be undesirable during silicon precipitation if it creates small platelet sizes such as to make platelet separation from the melt difficult.

While the invention is herein described particularly with reference to aluminum as the liquid metal solvent, it will be appreciated that the processing is applicable to embodiments in which other suitable solvents, such as those disclosed above, are employed, particular operating conditions, such as temperatures, metal/silicon ratios, cooling rates and the like being varied depending on the particular characteristics of any specific metal-silicon system.

For practical, commercial operations, the platelets will range generally from about 1/10 to 1 inch in size and will be removed from the solution of metallurgical grade silicon in the aluminum or other liquid metal solvent while it is still molten. For this purpose, the entire melt can be filtered through a suitable filter, such as perforated carbon plates, quartz wool and stainless steel screens. The parially purified, essentially iron-free silicon platelets float on the melt and, in an alternate removal technique, can be scooped from the solution melt surface as a semi-solid mass comprising said platelets and excess aluminum-silicon eutectic. In a generally preferred approach, this mass is subjected to centrifugal filtration to separate the partially purified silicon platelets from said excess eutectic material. The recovered essentially iron-free platelets will nevertheless have some adherent impurities derived from the metal solvent associated therewith. For example, using a centrifugal filter operating at 400 rpm, silicon platelets having only about 9% aluminum can be obtained from a semi-solid mass of crystallized platelets and eutectic fed to said filtration step at an overall gross composition of approximately 50% aluminum/50% silicon.

The adherent material, e.g. aluminum-silicon eutectic, is advantageously removed from the filtered platelets before the partially purified platelets are contacted with silica slag to produce a refined metallurgical silicon (RMS). In one embodiment of the invention, such adherent impurities can be removed from the platelets by acid leaching, with any suitable aqueous inorganic acid solution being employed in a wide range of suitable concentrations. Aqueous HCl solutions in concentrations of about 4 to about 37% by weight are generally preferred. To assure complete washing, the platelets are desirably crushed and passed, for example, through a 6 mesh screen, boiled in concentrated aqueous HCl for up to an hour, and finally washed in boiling water.

In an alternate embodiment, the adherent eutectic may be removed from the filtered platelets by washing the platelets with anhydrous alcohols, e.g. isopropyl alcohol or amyl alcohol, said alcohols reacting with the aluminum in said eutectic to form aluminum alkoxides, i.e. $Al(OR)_3$. The alkoxide has a resale value and, in a further embodiment, can be hydrolyzed to form hydrous aluminum oxide and the alcohol, which can be recycled for the washing of additional platelets. This embodiment thus represents a clean closed cycle process that may be less expensive than the acid leach referred to above even if a final HCl or other acid leach step were employed for the partially purified silicon material thus washed with said anhydrous alcohol.

Following the removal of adherent eutectic, the partially purified silicon will be essentially iron-free, having an iron content generally within the range of from about 3 to about 90 ppm, more typically, not exceeding about 20 ppm, i.e. parts per million parts by weight of said purified material. The aluminum content of said material will generally be in the range of from about 0.1 to about 0.5% by weight of said material, typically about 0.2% by weight. It is believed that the acid leaching or alcohol washing may effect some impurity removal beyond the removal of said eutectic. Iron removal in the eutectic removal operation would, of course, represent a further advantage — compensating in part for the cost of said step and its related waste acid environmental considerations.

The partially purified silicon platelets, essentially free of iron, and thereafter melted in contact with a silica slag in a melting zone to remove residual and adherent impurities from the platelets. While the solvent refining step described above results in a drastic reduction in the iron and titanium content of metallurgical silicon, microscopic inclusions of aluminum eutectic remains within the platelets. The slag oxidation occurring upon contact of the partially purified platelets with said silica slag results in the removing of residual and adherent impurities, including said aluminum eutectic, that are detrimental to the production of an acceptable solar cell substrate material capable of achieving a satisfactory level of solar cell efficiency. It will be understood that the platelets thus exposed to slag oxidation include such platelets as treated by means such as those above, including crushing, for the removal of adherent impurities from the partially purified platelets.

The partially purified silicon is contacted with said slag at temperatures above the melting point of silicon, e.g. at temperatures of from about 1410° C. to about 2000° C. Lower temperatures, from about 1410° C. to about 1600° C., are more efficient for oxidative removal of aluminum from silicon, with temperatures of from about 1410° C. to about 1500° C. being generally preferred. Lower temperatures, e.g. down to about 750° C., are less preferred. In general, the slag melting point should be less than the highest silicon melt temperature during slagging for rapid reaction kinetics.

In the practice of the slag oxidation step of the invention, silicon metal platelets are mixed with high purity slag powder and the mixture is heated to the contact temperature range indicated above. Alternatively, high purity slag powder components, preferably at a temperature of from about 1000°–1200° C., can be added directly to a melt of said silicon in a suitable crucible. Since the crucible must not contaminate the melt, most metal and metal carbides cannot be used therein. Carbon, silicon carbide, silicon nitride or silicon dioxide crucibles or crucible coatings are generally preferred. Any atmosphere that protects the crucible and melt from oxidation, such as argon, helium or nitrogen, is desirable with nitrogen being preferred for economic reasons.

The slag removes aluminum from the silicon, by oxidation, and dissolves the product $Al_2O_3$ with low resultant activity as is generally known in the art. For this purpose, high silica acid slags, i.e. slags in which the Si/O ratio lies between about ¼ and about ½, are employed. Since silicon reduces FeO and $TiO_2$ impurities in the slag and introduces them, as Fe and Ti, into the silicon, it is necessary that the highest purity slag components be employed for advantageous results.

The amount of slag employed will generally be on the order of from about 8% to about 12% by weight based on the weight of silicon, although it will be understood that commercially available slags may exist and have utility for purposes of the invention but at concentrations varying somewhat from those indicated herein. It is also within the scope of the invention to employ multiple slag steps, e.g. at said 10% slag concentration, to progressively lower the impurity level of the silicon being treated.

The slag should desirably contain less than about 10 ppm of each impurity reducible by molten silicon at the slag-silicon contacting temperature. Such impurities include FeO, $TiO_2$, $Cr_2O_3$, $B_2O_3$ and $V_2O_5$.

Any commercially available, high silica acid slag composition can be employed for the aluminum and other impurity removal purposes of the present invention. Illustrative examples of such available slag compositions are (1) those having 65–100% $SiO_2$, 0–20% MgO and 0–35% CaO, preferably 65% $SiO_2$, 10% MgO and 25% CaO; (2) those having 45–55% $SiO_2$ and 55–45% BaO, with 45% BaO/55% of $SiO_2$ being preferred; and (3) those having 50–85% $SiO_2$, and 15–50% $Na_2O$, with 75% $SiO_2$/25% $Na_2O$ being preferred.

Enhanced slag-silicon contact speeds the purification reactions, and, thus stirring is preferred although the process is operable in the absence of stirring. Operable stirring rates are those that minimize melt splashing, such as rates of about 1–100 rpm.

After the slag oxidation reaction in the melting zone has removed residual and adherent impurities, particularly including aluminum, from the silicon, the thus-slagged silicon is removed from the melting zone and cooled, as by chill casting. The resulting solidified product is a low-cost, multigrained refined metallurgical silicon (RMS) having a substantially higher impurity content level than in conventional, high purity semiconductor grade silicon but nevertheless constituting a valuable intermediate in the production of solar cell substrates.

In another embodiment of the invention, the silicon-slag melt is removed from the melting zone in a unidirectional manner so as to directionally solidify the silicon. For this purpose, the silicon-slag melt is slowly withdrawn, in its refining crucible, from the melting zone, as by slowly lowering the refining crucible from said zone. For example, the invention has been practiced in operations in which the refining crucible has been slowly withdrawn from the melting zone at a rate of approximately 1 inch per hour. The slow withdrawal of the crucible results in the unidirectional solidification, or freezing, of the charge that initially is entirely molten. Such directional solidification results in the obtaining of solidified refined metallurgical silicon and a region of solidified melt having a high concentration of impurities rejected by the refined silicon as it solidifies. Thus, there is no build-up of impurities at the solidification interface. The impurities remain uniformly distributed in the melt as silicon slowly solidifies in a unidirectional manner therefrom. The directionally solidified refined metallurgical silicon (DS/RMS) thus obtained is a low-cost multigrained silicon having a substantially higher impurity level than in conventional high purity semiconductor grade silicon while, at the same time, having suitable properties for desirable solar cell applications. It will be appreciated that it is also within the scope of the invention to re-melt said DS/RMS and to directionally solidify the silicon again to obtain further separation of refined silicon from a solidified melt of high impurity concentration.

Upon solidification of a silicon-slag melt, the interface between the slag and the silicon is not always well defined, resulting in the possibility of some material wastage. Upon directional solidification, the separation of silicon and slag is good. It has generally been found that when a quartz container is used to hold the reaction mixture, the slag is on the bottom and the silicon on the top, whereas the positioning appears to be reversed when a graphite crucible is employed. The DS/RMS having large columnar grains can readily be mechanically separated from the solidified melt having small grains of high impurity concentration when the mass is cold.

The RMS and DS/RMS multigrained products produced in accordance with the present invention have resistivity values, using a 4-point probe method, within the range of from about 0.04 to about 0.2 ohm-cm, whereas semiconductor grade silicon has a resistivity of greater than 10 ohm-cm. The resistivity is a manifestation only of uncompensated charge carriers. The resistivity is determined by the number of uncompensated impurity atoms present, and is thus a measure of the utility of the silicon that is different than the range of chemical composition of the silicon. The chemical composition per se can be misleading since impurities of Group III and Group V elements compensate each other electronically. It will also be appreciated that the precise composition of any particular RMS or DS/RMS product will vary depending on a variety of the processing conditions set forth above, and on the composition of the metallurgical grade silicon starting material, the liquid metal solvent, the silica slag and various other factors. Because of all or a combination of these factors, the concentration of individual impurities in the product is subject to considerable variation, the overall impurity level being such that the low-cost, multigrained products of the invention have suitable properties for desirable solar cell and other silicon applications although said impurity level is substantially higher than in conventional high purity semiconductor grade material. Thus, the RMS product, having a resistivity of from about 0.04 to about 0.2 ohm-cm, typically about 0.1 to about 0.2 ohm-cm, may have impurity concentrations of up to, but not generally exceeding, about 15 ppm of aluminum, about 80 ppm of iron, about 15 ppm of titanium, about 2 ppm of boron, about 2 ppm of phosphorus, about 10 ppm of chromium, about 100 ppm of calcium and about 65 ppm of magnesium. In particular embodiments of the invention, various impurities may have a concentration considerably below these limits and, it will be appreciated, concentrations of individual impurities may somewhat exceed the limits specifically set forth without significant deviation from the scope of the invention. Thus, aluminum and iron contents of on the order of 10 ppm have been obtained particularly with a calcium-magnesium type slag. While the use of a sodium type slag has resulted in an aluminum content of about 5 ppm, the corresponding iron level was about 80 ppm. Likewise, calcium and magnesium levels of about 100 ppm and 63 ppm, respectively, were obtained when a calcium-magnesium slag was employed, with such levels being about 1 ppm and 4 ppm, respectively, when a sodium-type slag was employed. These examples will serve to illustrate the innumerable variations in composition obtainable for the RMS products of the invention within the overall composition levels and resistivity values indicated above. It will be appreciated that the term "ppm" as used herein shall mean parts per million by weight unless otherwise noted.

Likewise, the DS/RMS products of the invention have been found to have a resistivity of from about 0.04 to about 0.2 ohm-cm, typically from about 0.1 to about 0.2 ohm-cm. Such products may have impurity concentrations of up to, but not generally exceeding, about 1 ppm of aluminum, about 1 ppm of iron, about 2 ppm of titanium, about 2 ppm of boron, about 2 ppm of phosphorus, about 1 ppm chromium, about 1 ppm of calcium and about 1 ppm of magnesium. Once again, it should be noted that various individual impurities may depart somewhat from the specific limits indicated without departure from the scope of the invention. It should also be noted that, although the impurity levels from DS/RMS are lower than for RMS, the resistivity values are within the same general range, denoting that the number of uncompensated impurity atoms was approximately the same at the different impurity concentration levels. As indicated above, semiconductor grade material will have resistivities of up to 10 ohm-cm or more, together with very low concentration levels beyond the limits of detection for each impurity. The RMS and DS/RMS of the present invention, therefore, represent relatively impure grades of silicon having, nevertheless, desirable utility in the production of solar cell substrates and for other known silicon applications, such as in rectifiers, where the purity requirements are less restrictive than in transistor uses and specialized solar cell applications in which high purity silicon made from semiconductor grade material is required regardless of the cost thereof.

The RMS and DS/RMS materials as described above can be further refined by the well-known Czochralski pulling technique to produce desirable solar cell substrate materials. According to this technique, boules of further refined metallurgical silicon can be pulled, on a rotating silicon seed rod, from a melt of said RMS and DS/RMS materials. For this purpose, the seed rod is slowly moved, i.e. lifted, while maintaining an interface between the rod with said boule being grown thereon and the molten silicon, i.e. RMS or DS/RMS, from which said boules are pulled. In the application of this known technique for purposes of the present invention, boules of refined crystals have been grown employing a seed rod movement of about 3.5 inches per hour, employing temperature gradients and seed rotation rates in combination therewith, consistent with the features of the particular boule pulling apparatus employed. The resulting boules pulled from an RMS melt, i.e. a Cz-RMS material, are low-cost, multigrained materials of sufficient purity so that wafers cut therefrom achieve an acceptable level of solar cell efficiency. Multigrained Cz-DS/RMS material can be obtained by the pulling of boules from a DS/RMS material prepared as indicated above. Somewhat higher solar cell efficiencies are obtainable with this material than with corresponding Cz-RMS material. It is also within the scope of the invention to separate the DS/RMS material, as originally prepared, from the region of solidified melt, to then re-melt said DS/RMS and to remove the resulting melt slowly from the melting zone, in a unidirectional manner, so as to directionally solidify the silicon a second time. A DS/RMS of enhanced purity is thus obtained and may be separated from a region of solidified melt having a high concentration of the remaining impurities therein. By pulling boules from this DS/RMS material, low-cost single crystal silicon is obtained. While said material, and the multigrained Cz-RMS and Cz-DS/RMS materials indicated above, has a substantially higher impurity level than conventional, high purity semiconductor grade material, it nevertheless has sufficient purity to achieve very acceptable solar cell efficiencies when employed, in wafer form, as the solar cell substrate material. It will be appreciated that various processing techniques will be employed by those performing the Czochralski pulling form of crystal growth on a commercial basis to enhance the efficiency of said technique. Such techniques are not within the scope of the present invention since the pulling of boules as provided herein is a conventional step apart from its use in combination with the other features of the invention for the production of low-cost refined metallurgical silicon products. The Czochralski technique, which was first developed in about 1917 with regard to the withdrawal of seeds of Pb, Sn and Zn from the melt, is described in "Silicon Semiconductor Technology" by W. R. Runyan (McGraw-Hill), pp. 34–39 and in "The Growth of Single Crystals" by R. A. Laudise (Prentice-Hall) (1970), pp. 174–176.

The multigrained Cz-RMS product of the invention will have a resistivity value of from about 0.1 to about 0.2 ohm-cm, with impurity contents of up to, but not generally exceeding about 1 ppm of aluminum, about 1 ppm of iron, about 0.5 ppm of titanium, about 3 ppm of boron, about 3 ppm of phosphorous, about 0.5 ppm of chromium, about 0.5 ppm of calcium, and about 0.5 ppm of magnesium. The multigrained Cz-DS/RMS product will have a resistivity value of about 0.04 to about 0.2 ohm-cm, with impurity concentrations of up to, but not generally exceeding, about 0.2 ppm of aluminum, about 0.15 ppm of iron, about 0.03 ppm of titanium, about 1.5 ppm of boron, about 0.2 ppm of phosphorus, about 0.02 ppm of chromium, about 0.7 ppm of calcium and about 0.05 ppm of magnesium. The single crystal Cz-DS/RMS will have a resistivity value of from about 0.05 to about 0.2 ohm-cm, with impurity concentrations of from about 0.2 ppm of aluminum, about 0.15 ppm of iron, about 0.02 ppm of titanium, about 1.5 ppm of boron, about 0.15 ppm of phosphorus, about 0.01 ppm of chromium, about 0.7 ppm of calcium and about 0.17 ppm of magnesium. It should be noted that, although the crystal pulling step is a further refinement of the RMS and DS/RMS materials, the resistivity levels obtained are not significantly different and may appear to represent a more impure product despite the reduction in impurity concentrations achieved by said Czochralski-pulling technique. As indicated above, this circumstance results from the fact that the resistivity is a manifestation only of uncompensated charge carriers, with a decrease in the impurity levels of the various impurities actually resulting, in some instances, in an increase in the number of such uncompensated charge carriers.

Planar diodes and related solar cells of acceptable efficiency can be made by techniques known in the art employing the Cz-RMS, DS/RMS and Cz-DS/RMS multigrained and single crystal materials described above as substrates therefor. Such solar cell structures include epitaxial n-on-p-on-p substrate planar diodes and solar cells in which p-and n-type epitaxial layers are grown on a passive p-type substrate of one of said refined silicon materials. Diffusion-type structures in which the substrate is an active, p-type silicon substrate having n-type impurities diffused into one side to form a p-n junction therein are also within the scope of the invention. Upon the affixing of electrical contacts to the n-type layer and to the p-type substrate in the case of epitaxial cells, or to both sides of the diffusion-type cells, the product constitutes a solar cell with said contacts serving to control the flow of electricity produced by the photovoltaic effect upon absorption of sunlight by said solar cell.

Silicon wafers employed for solar cell purposes will ordinarily have a thickness of from about 4 to about 40 mils, preferably from about 10 to 20 mils, although the invention is not limited by substrate thickness other than is known in the art generally with respect to the substrates of solar cell structures. The refined metallurgical silicons of the present invention have relatively large, pure grains, generally with a grain size of not less than about 300 grains/cm$^2$. After the substrate has been cut into wafers, or cast into sheets, it will generally be lapped and chemically etched with one of a number of known, available etching compositions for about ½–2 minutes to give the surface a smooth matte finish. A composition containing 15 parts of conc. (70%) $HNO_3$, 5 parts of glacial $HOA_c$, 2 parts of 49% HF is an example of the suitable compositions that can be used for this purpose, preferably at elevated temperatures such as 1100° C.

In epitaxial deposition via the dissociation of silane or a halosilane, silicon layers are deposited on the substrate under controlled thermal conditions so as to grow, respectively, p- and n-type epitaxial layers that duplicate the underlying substrate grain boundary structure. Gases suitable for this purpose include, but not limited to, $SiH_4$ $SiCl_4$, $SiCl_2H_2$ and the like. While the deposition temperature employed may be varied somewhat for different gases, said temperature will generally be from about 800° C. to about 1400° C., preferably about 900°–1200° C.

For p-layer deposition, the composition of the gas stream, the deposition temperature and time are selected so as to obtain a p-layer of at least 2 microns up to about 100 microns, with a thickness in the range of about 25–40 microns being generally preferred. In accordance with conventional practice, the doping conditions, i.e. the impurity conditions conducive to the growth of a p-type layer, are adjusted in the gas phase so that the deposited epitaxial layer will have a resistivity of not less than about 0.01 ohm-cm and up to about 10 ohm-cm. The n-layer is then similarly deposited, using appropriate n-type dopants, under conditions of concentration, time and temperature to give a thin epitaxial doped n-layer having a thickness of from about 0.01 to about 10 microns, preferably less than about 0.5 microns. The resistivity of the n-layer should generally be from about 0.0005 to about 10 ohm-cm.

The deposition rate achieved, as is known in the art, is dependent on the source of silicon, and, as a result, the deposition time and temperature, and the dopant concentration in the gas must be adjusted for various gases and desired deposition times.

In the epitaxial growth of p-and-n-type layers to form the desired n-on-p-on-p substrate structure, vapor deposition occurs from any suitable silicon-bearing gas, such as those indicated above, suitably doped with appropriate impurities to form the desired p-and n-type epitaxial layers. For p-type layers, any suitable trivalent element impurity, such as boron or aluminum, may be employed. Borane, $B_2H_6$, is commonly employed as the p-layer dopant. As is known in the art, pentavalent impurities, such as phosphorous and arsenic, are suitable n-type dopants, with phosphine ($PH_3$) or arsine being commonly employed as n-layer dopants.

In diffusion-type solar cell structures, the substrate material serves as an active substrate whereas the epitaxial structure utilizes the substrate as a passive substrate with said p-and n-type layers grown thereon to form the requisite p-n junction. In the diffusion-type structure, pentavalent n-type impurities are diffused under similar conditions into one side of the structure to form the p-n junction within said substrate material. Phosphine and arsine are, once again, suitable dopants for purposes of diffusing the desired n-layer into p-type, active substrates constituting the novel refined metallurgical silicon materials of the present invention.

Upon forming the epitaxial or diffusion type structure as indicated above, contacts are affixed to the light-receiving, or front, side and the back surfaces thereof. As is known in the art, the contacts contribute a finite series resistance to the overall series resistance of the cell and thus should be minimized. The amount of shading caused by the metallized pattern on the light-receiving n-layer surface must be minimized. As wider contacts have less resistance but also create more shading, a balance between these factors must be made. A "comb-like" pattern has presently been employed for the front side contact. Employing conventional techniques, titanium can be deposited by electron beam vacuum evaporation to provide a layer of at least about 200Å, e.g. 400-1000Å, on the front side surface. A layer of silver having a thickness of from about 1 to about 5 microns, e.g. 2-3 microns, is then deposited on the titanium on the light-receiving, front or n-layer surface. Such Al/Ti contact systems are commonly used on solar cell devices. The thickness of the evaporated films can be conveniently monitored with an Inficon thin-film thickness monitor. Aluminum is employed, in accordance with conventional practice, as the back side contact.

The front and back side contacts are "sintered" by heating the cell in a reducing atmosphere for 5 to 10 minutes at a temperature in the range of from about 500° C. to about 625° C. It will be appreciated that other contact materials known in the art can also be employed, and that other known means can be employed for depositing the desired contact layers on the front and back surfaces of the cell.

It will be appreciated that a suitable antireflection coating is important in maximizing solar cell performance. Evaporated $Ta_2O_5$ films have been conveniently employed for this purpose.

EXAMPLE 1

Four hundred grams of silicon metal containing 1.25% Fe and 0.48% aluminum were dissolved in 865 grams of molten aluminum alloy solvent, said aluminum containing 0.2% Cr. 0.05% Mn and 0.1% Zn, at 1050° C. under a protective nitrogen atmosphere in a graphite crucilble. The homogeneous Al/Si solution was cooled from 1050° C. to 690° C. at the rate of 60° C./hr., thereby precipitating partially purified silicon platelets. The platelets were separated from the molten aluminum by filtration through a quartz wool filter medium. The recovered platelets were washed in an aqueous HCl solution to remove adherent Al/Si eutectic material and crushed through a 6 mesh screen. The 6-20 mesh fraction was boiled with concentrated HCl and washed with boiling water. Emission spectrographic analysis showed an aluminum content of 1,000-1500 ppm and an iron content of 20-50 ppm in the recovered platelets. One thousand grams of silicon platelets from several such preparations were combined and melted in a graphite crucible at 1500° C. An acid silica slag having 25% CaO, 10% MfO and 65% $SiO_2$ in an amount of about 20% by weight was added to the silicon melt, and the mixture was periodically hand stirred using a graphite rod over a total contact time of 40 minutes. The purified silicon melt was chill cast in a graphite crucible in air, yielding 850 grams of multigrained refined metallurgical silicon (RMS). Elemental analysis showed that said RMS contained about 9 ppm of aluminum, about 13 ppm of iron, about 2 ppm of titanium, about 3 ppm of chromium, about 100 ppm of calcium and about 63 ppm of magnesium. Boron and phosphorous values were not obtained. The resistivity of the RMS was from about 0.1 to about 0.2 ohm-cm.

The RMS was employed as a useful, low-cost intermediate from a melt of which boules of further refined material was pulled on a rotating silicon seed rod utilizing the well-known Czochralski pulling technique. Acoording to this known technique, the seed rod was slowly moved while maintaining on interface between the rod with said boule being grown thereon and the molten silicon from which the boules were pulled. Movement of the seed rod was at about 3.5 inches per hour, with the diameter of the boules being about 2 inches. The resulting Czochralski-pulled materials, i.e. Cz-RMS, was a multigrained silicon having a resistivity of from about 0.1 to about 0.2 ohm-cm, having impurity contents of about 1 ppm of aluminum, about 1.1 ppm of iron, less than about 0.5 ppm of titanium, about 0.5 ppm of chromium, less than 0.5 ppm of calcium and less than about 0.5 ppm of magnesium. The Cz-RMS materials thus produced can be used as active and passive solar cell substrate material in the production of planar diodes and related solar cell structures as indicated herein.

EXAMPLE 2

One thousand grams of metallurgical grade silicon containing 0.32% Fe and 0.21% aluminum was dissolved in 3,000 grams of the molten aluminum solvent used in Example 1 at 950° C. in a graphite crucible having a protective nitrogen atmosphere. The resulting melt was cooled at 60° C./hour to 710° C., thereby precipitating relatively pure silicon platelets. The partially purified product was scooped from the melt surface using a perforated graphite bucket and filtered through a quartz wool filter medium. Following washing in aqueous HCl to remove adhering eutectic material as in Example 1, the resulting 6-20 mesh platelet fraction was shown, by emission spectrographic analysis, to contain more than 2,000 ppm of aluminum and less than 30 ppm of iron. A melt of said platelets was contacted, at 1500° C., with an acid silica slag, containing 45% BaO and 55% $SiO_2$, amounting to 20% by weight of the silicon melt. Contact time was about 30 minutes in a quartz container. The resulting multigrained RMS was found, upon elemental analysis, to contain about 15 ppm of aluminum, about 46 ppm of iron, about 14 ppm of titanium, about 1.6 ppm of chromium, about 15 ppm of calcium and about 1.8 ppm of magnesium. Boron and phosphorus were not measured. The resistivity of the material was about 0.1 to about 0.2 ohm-cm. The RMS can be effectively employed as a low-cost intermediate in the production of Cz-RMS as indicated above, with said Cz-RMS being useful as a substrate for the production of epitaxial and/or diffusion type planar diodes and corresponding solar cells having adequate solar cell efficiencies to merit consideration for practical commercial solar cell applications.

EXAMPLE 3

By means of processing similar to that described in the examples above, RMS has been made from acid silica slag containing 25% $Na_2O$ and 75% $SiO_2$. The resultant RMS product is a low-cost, multigrained silicon having a resistivity of from about 0.1 to about 0.2 ohm-cm, with impurity concentrations of about 5.4 ppm of aluminum, about 80 ppm of iron, about 7 ppm of titanium, about 8.8 ppm of chromium, about 1.3 ppm of calcium and about 3.8 ppm of magnesium. Boron and phosphorus contents were not measured. The product RMS can likewise be used in the production of Cz-RMS as indicated above suitable for use as low-cost substrate material in epitaxial and diffusion type solar cell structures capable of achieving acceptable solar cell efficiencies.

EXAMPLE 4

Metallurgical grade silicon containing 1.25% iron and 0.48% aluminum is dissolved in aluminum alloy solvent containing 0.2% Cr, 0.05% Mn and 0.1% Zn at 1050° C. The solution, containing 35% Si and 65% Al, is cooled to 710° C. at the rate of 60° C./hour, precipitating partially purified silicon platelets. Following washing with an aqueous HCl solution, said platelets are crushed to a 6–20 mesh size and melted in contact with a 45% BaO/55% $SiO_2$ slag employed in an amount of about 10% by weight of silicon. Upon contact in the melting zone for about 45 minutes at 1450° C., the melt is slowly removed rate of about 6 inches in a 6 hour time period, causing the directional solidifcation of the refined silicon material with a separate region of solidified melt having a high concentration of impurities rejected by the refined metallurgical silicon as it solidifies. After cropping the top containing said region of solidified melt, the resulting product is a low-cost, multigrained directionally solidified refined metallurgical silicon (DS/RMS) having suitable properties for solar cell applications. Such DS/RMS has a resistivity level of from about 0.04 to about 0.2, typically about 0.1 to about 0.2, ohm-cm and impurity concentrations of less than 1 ppm aluminum and iron, less than 2 ppm of titanium, less than 5, typically about 3, ppm of phosphorus, less than 1 ppm of chromium, less than 1 ppm of calcium and less than 1 ppm of magnesium. The boron content was not measured.

The DS/RMS product can be employed as a solar cell substrate material directly, or can be further refined, as by the above-indicated Czochralski-type crystal growth to produce both multigrained and single crystal Cz-DS/RMS material. All such materials can be employed as passive substrate wafers upon which epitaxial p-and n-type layers can be grown to form n-on-p-on-p substrate planar diodes and solar cells by conventional techniques. Said materials can also be employed as active p-type substrates upon one side of which pentavalent n-type impurities, such as phosphine can be diffused to form a p-n junction therein by conventional means known in the art. The single crystal Cz/DS/RMS material can readily be formed by remelting and redirectionally solidifying said DS/RMS before the pulling of boules therefrom or, less desirably, by re-melting and re-pulling boules from a melt of the boules of multigrained DS/RMS.

DS/RMS materials prepared as indicated above were melted and boules of further refined material were pulled from the melt by the Czochralski technique, using a seed pull rate of about 3.5 inches/hour. A multigrained, Cz-DS/RMS prepared in this manner had a resistivity of on the order of 0.5 ohm-cm, with impurity concentrations of about 0.19 ppm of aluminum, about 0.11 ppm of iron, about 0.03 ppm of titanium, about 1.1 ppm of boron, about 0.16 ppm of phosphorus, about 0.02 ppm of chromium, about 0.65 ppm of calcium and about 0.05/ppm of magnesium. Multigrained DS/RMS was remelted for a second generation Cz-pull, with boules being pulled from the remelt under the same conditions as in the first boule pulling step. A single crystal, Cz-DS/RMS was obtained in this manner, said material having a resistivity of about 0.05 ohm-cm, with impurity concentrations of about 0.19 ppm of aluminum, about 0.11 ppm of iron, about 0.11 ppm of iron, about 0.02 ppm in titanium, about 1.1 ppm of boron, about 0.12 ppm of phosphorus, about 0.01 ppm of chromium, about 0.64 ppm of calcium and about 0.16 ppm of magnesium. Similar impurity levels are obtainable by the more commercially preferred technique in which the RMS is directionally solidified a second time prior to the pulling of single crystal boules from a melt of said twice directionally solidified RMS.

EXAMPLE 5

Cz-RMS multigrained material having an impurity content and resistivity value as set forth in Example 1 is used as a passive substrate wafer 0.012 inch thick in the production of epitaxial type solar cells. Following etching to provide a matte finish on the surface and cleaning, epitaxial layers, first p doped and then n doped, are grown on the substrate. The epitaxy is carried out in a heated, horizontal reactor with a SiC coated graphite susceptor and a water cooled quartz tube. Deposition is achieved at about 1060° C. using a 0.45% electronic grade $SiH_4$ diluted in extra dry grade $H_2$, further purified by passing the gas through a Linde 5A molecular sieve trap immersed in liquid nitrogen. A growth rate of 0.4 microns/minute is used for both layers. The p-epitaxy was accomplished by adding 0.34% grade $B_2H_6$ to the $SiH_4/H_2$ gas stream and growing a layer 25 microns thick, said layer having a resistivity of 0.2 ohm-cm. The n-doped layer is then grown epitaxially on the p-layer by adding 1.3% $PH_3$ to the $SiH_4/H_2$ gas stream. The n-doped layer is 2.4 microns thick, and has a resistivity of about 0.004 ohm-cm. The sample is then masked on the n-grown side, i.e. the front, light-receiving side, using Apiezon wax or Beeswax, and a chemical etch, i.e. 10% HF, is used to remove undesired n-doped growth on the back of the sample and to electrically isolate the p substrate layer from the top n-layer. The resulting n-on-p-on-p substrate structure is then rinsed with a solvent, i.e. isopropyl alcohol, to dissolve the wax after which metal contacts are applied to the sample. Both the n side and p substrate contacts are formed by vacuum evaporation in a multiple rotatable hearth electron beam evaporating system. A 400Å layer of titanium, followed by a 2–3 micron layer of silver is applied for the front or light-receiving n-layer, ohmic contact grid. The front Ti-Ag contact is annealed at about 400°–575° C. in forming gas, i.e. 10% $H_2$, 90% $N_2$, for about 5-15 minutes. The back, or p substrate ohmic contact, is 2-3 microns of aluminum and is likewise annealed in said forming gas. An anti-reflection coating of tantalum pentoxide is then applied to the light-receiving front side by vacuum evaporation so that the reflection of incident sunlight is minimized. The solar cell prepared in this manner, multigrained with relatively large grains, has an area of 4.7 cm$^2$ and an Air Mass 1 (AMI) efficiency of 9.2%. It will be understood that said AMI efficiency is based on conditions that approximate a clear sunny day at about noon time in the Northeast U.S.A. taken as 100 milliwatts (cm$^2$ or 97 watts per square foot. The open-circuit voltage, $V_{oc}$, of the cell is 0.557 volts, and the short-circuit current density is 24.1 milliamps/cm$^2$, i.e. ma/cm$^2$. The fill factor, i.e. FF, of the cell is 66%. It will be appreciated that the FF is a measure of the squareness of the I-V curve for the cell and is defined as the maximum area inscribed/-($I_{sc}$)($V_{oc}$) or $I_{max}$ x $V_{max}/I_{sc}$ x $V_{oc}$, where $I_{sc}$ is the short circuit current in milliamps.

Similarly, an n-on-p-on-p substrate epitaxial solar cell having p-and-n-layers grown as above is prepared with an area of 3.4 cm$^2$ and having an efficiency of 9.4%. The $V_{oc}$ of said cell is 0.552, its $J_{sc}$ is 25.3 ma/cm$^2$, with a FF of 65%.

EXAMPLE 6

In similar fashion to the procedures of Example 5, a solar cell is prepared using the multigrained DS/RMS material of Example 4. The substrate has a thickness of 0.030–0.035 inch with said p-layer grown to a thickness of 40 microns, and having a resistivity of 0.3 ohm-cm. The n-layer has thickness of 0.5 microns, with a resistivity of 0.01 ohm-cm. The area of the solar cell is 2.5 cm$^2$, and an AMI efficiency of 8.9% is obtained, with the efficiency prior to applying the anti-reflection coating being 6.2%. The cell with said anti-reflective coating also has a $V_{oc}$ of 0.556 volts, a $J_{sc}$ of 22.9 ma/cm$^2$, and a FF of 69%.

EXAMPLE 7

A solar cell is likewise prepared by the procedures of Example 5 using the multigrained Cz-DS/RMS material of Example 4. The substrate has a thickness of 0.010–0.011 inch, with the epitaxial p layer having a thickness of 25 microns and a resistivity of 0.2 ohm-cm. The n-layer has a thickness of 0.2 microns. The area of the cell is 4.5 cm$^2$ and an AMI efficiency of 9.6% is obtained. This multigrained cell having relatively large, columnar grams, is also found to have a $V_{oc}$ of 0.568 a $J_{sc}$ of 23.7 ma/cm$^2$, and a FF of 69%.

EXAMPLE 8

A single grained Cz-DS/RMS material as set forth in Example 4 is likewise employed to prepare an epitaxial-type solar cell using the procedures set forth in Example 5. A single crystal wafer having a thickness of 0.012 inch is employed, with the p-layer grown thereon having a thickness of 25 microns and a resistivity of 0.2 ohm-cm. The n-layer has a thickness of 0.2 microns with a resistivity of 240 ohm/square. The resulting single crystal cell has an area of 4.2 cm$^2$, and an AMI efficiency of 10.6% is achieved therewith. Said cell has a $V_{oc}$ of 0.571 volts, a $J_{sc}$ of 24.8 ma/cm$^2$ and a FF of 73%.

A similar single crystal cell, produced from a single crystal Cz-DS/RMS such as that disclosed in Example 4 in accordance with the procedures set forth in Example 5, produced an AMI efficiency of 10.3% at an area of 5.15 cm$^2$, with a $V_{oc}$ of 0.578 volts, a $J_{sc}$ of 27.0 ma/cm$^2$ and a FF of 63%.

EXAMPLE 9

Diffusion-type solar cells are prepared by the diffusion of n-type phosphorous dopant from phosphine gas (PH$_3$) in a nitrogen carrier gas into various substrates made from the Cz-RMS material as described in Example 1, with contacts applied as indicated in Example 5. At diffusion times of 30 minutes, an AMI efficiency of 9.8% is obtained at a diffusion temperature of 800° C. for a cell having an area of 4.5 cm$^2$/ Said cell has a $V_{oc}$ of 0.590, a $J_{sc}$ of 22.0 ma/cm$^2$, and a FF of 73%. At a diffusion temperature of 850° C., an efficiency of 9.3% is obtained for said 4.5 cm$^2$ cell, with a $V_{oc}$ of 0.574, a $J_{sc}$ of 22.8 ma/cm$^2$ and a FF of 67%. In another embodiment at 800° C. diffusion temperature and 30 minute diffusion time, an AMI efficiency of 10.9% is obtained with a cell area of 4.6 cm$^2$, with a $V_{oc}$ of 0.594, a $J_{sc}$ of 23.5 and a FF of 74%, all values measured after he application of the antireflective coating. In such diffusion techniques at 800° C. for a diffusion time of only 15 minutes, an efficiency below the acceptable level for practical solar cell application is obtained under the precise conditions applied for diffusion, and for the forming of contacts as was indicated above in Example 5.

EXAMPLE 10

In a manner similar to that of Example 9, Cz-DS/RMS single crystal material as described in Example 4 and having a resistivity of 0.55 ohm-cm is employed to produce diffusion-type solar cells having a size of about 4.2cm$^2$, with the diffusion time being 30 minutes. At a diffusion temperature of 800° C., an AMI efficiency of 12.1% is obtained. The resistivity of the diffusion sheet is 67 ohm/square, and the $V_{oc}$ is 0.606 volts, the $J_{sc}$ is 26.7 ma/cm$^2$ and the FF is 71%. All values were measured after application of the anti-reflective coating, at 850° C. diffusion temperature, a similar cell, having a sheet resistivity of 32 ohms/-square, obtains an AMI efficiency of 12.1%, with a $V_{oc}$ of 0.614 volts, a $J_{sc}$ of 25.2 ma/cm$^2$ and a FF of 75%. Using a multigrained Cz-DS/RMS of 0.06 ohm-cm resistivity of 4.5cm$^2$ area at a diffusion temperature of 800° C. for 30 minutes, a solar cell of 7.1% AMI efficiency is obtained, said cell having a sheet resistivity of 63 ohms/square, a $V_{oc}$ of 0.575 volts, a $J_{sc}$ of 15.8 ma/cm$^2$ and a FF of 76%.

It will be appreciated that the claimed melting of partially purified platelets in contact with said silica slag includes also the contacting of a melt of said platelets with the slag to effect the desired removal of aluminum and other impurities as indicated in the examples. It is also pointed out that the silicon products will likely include impurities other than those specifically recited, the latter group being selected on the basis of their general significance to the functioning of the materials for solar cell applications and as distinguishing the products of the invention from those of the prior art. While boron and, in some specific examples, phosphorus were not measured, these impurities were included as being impurity components having some measure of effect on the performance of the products of the invention. The boron and phosphorus levels recited for said impurities have been determined on the basis of the analysis of certain specific samples of the silicon products of the invention and related general information concerning the concentration of such impurities in silicon materials.

The present invention provides a novel epitaxial and diffusion-type solar cells made from refined metallurgical silicons having a desirable combination of low-cost and a purity level such that adequate solar efficiencies can be obtained thereby. While the refined silicons of the invention are relatively impure as compared to semiconductor grade material, they provide an attractive economic-technical alternative to the use of such high cost, high purity material. Thus, single crystal Cz-DS/RMS material was shown to achieve 10.6% efficiency as a passive substrate. Significantly, multigrained Cz-DS/RMS achieved a 9.6% efficiency, a multigrained Cz-RMS achieved over 9.0% efficiency, e.g. 9.2 and 9.4%, and a DS/RMS, without crystal pulling achieved an efficiency of 8.9%. Adequate efficiencies can also be achieved in diffusion-type solar cells with low-cost active substrates made from DS/RMS and from Cz-modifications of said DS/RMS and of the RMS material of the present invention. Thus, efficiencies of about 12% have been illustrated for cells made from single crystal Cz-DS/RMS and of 9–11% with Cz-RMS. The product flexibility thus indicated renders the invention suitable for adaptation to the particular requirements of specific, practical solar cell applications.

The present invention thus constitutes a significant advance in the field of solar energy technology. It represents, therefore, a major step in the urgently needed development of solar energy as a commercially feasible, non-polluting energy source for satisfying significant portions of the energy needs of industrial societies throughout the world.

What is claimed is:

1. A low-cost, multigrained, epitaxial n-on-p-on-p substrate planar diode comprising p-and-n-type epitaxial layers grown on a passive p-type, multigrained, silicon substrate, said layers duplicating the underlying substrate grain secondary structure, said silicon substrate having been produced by the process comprising:
   a. removing silicon platelets from a solution of metallurgical grade silicon in a liquid metal solvent, thereby recovering partially purified, essentially iron-free silicon platelets with adherent impurities derived from said metal solvent;
   b. melting said partially purified silicon platelets in contact with acid silica slag in a melting zone, the resulting slag oxidation removing residual and adherent impurities from said silicon; and
   c. pulling refined metallurgical silicon boules from a melt of the thus-refined silicon on a rotating silicon seed rod,
   whereby said substrate is produced at a substantially higher impurity level than in conventional high purity semiconductor grade silicon while the resulting low-cost diode has desirable solar cell properties.

2. The planar diode product of claim 1 in which said liquid metal solvent is aluminum or an aluminum alloy and said seed rod is slowly moved while maintaining an interface between the rod with said boule being grown thereon and the molten silicon from which said boules are pulled.

3. The product of claim 2 in which said removing of silicon platelets from solution comprises cooling the liquid solution of silicon in molten aluminum to a temperature not below the eutectic temperature of about 577° C., thus forming a supersaturated hypereutectic aluminum-silicon solution and causing silicon platelets to precipitate therefrom.

4. The product of claim 3 in which said partially purified platelets are contacted with said silica slag at a temperature of from about 1410° C. to about 2000° C., said slag having an Si/O ratio of between about ¼ and about ½, said slag being employed in an amount within the range of from about 8% to about 12% by weight based on the weight of silicon platelets melted in contact therewith.

5. The product of claim 4 in which said slag is of high purity, the concentration of each impurity in the slag reducible by molten silica at the silicon platelet-silica slag contacting temperature being less than about 10 ppm.

6. The product of claim 1 and including electrical contacts affixed to said n-type layer and to said substrate, said product constituting a solar cell with said contacts serving to control the flow of electricity produced by the photovoltaic effect upon absorption of sunlight by said solar cell.

7. The product of claim 4 and including electrical contacts affixed to said n-type layer and to said substrate, said product constituting a solar cell with said contacts serving to control the flow of electricity produced by the photovoltaic effect upon absorption of sunlight by said solar cell.

8. A low-cost, multigrained epitaxial n-on-p-on-p substrate planar diode comprising p-and-n-type epitaxial layers grown on a passive p-type multigrained, silicon substrate, said layers duplicating the underlying substrate grain boundary structure, said silicon substrate having been produced by the process comprising:
   a. removing silicon platelets from a solution of metallurgical grade silicon in a liquid metal solvent, thereby recovering partially purified, essentially iron-free silicon platelets with adherent impurities derived from said metal solvent;
   b. melting said partially purified silicon platelets in contact with acid silica slag in a melting zone, the resulting slag oxidation removing residual and adherent impurities from the silicon platelets; and
   c. removing the silicon-slag melt from said melting zone in a unidirectional manner so as to directionally solidify said silicon, said directional solidification resulting in the obtaining of solidified refined metallurgical silicon and a region of solidified melt having a high concentration of impurities rejected by the silicon as it solidifies, whereby said substrate is produced at a substantially higher impurity level than in conventional high purity semiconductor grade silicon while the resulting low-cost diode has desirable solar cell properties.

9. The product of claim 8 in which said liquid metal solvent is aluminum or an aluminum alloy.

10. The product of claim 9 in which the removing of silicon platelets from solution comprises cooling the liquid solution of silicon in molten aluminum to a temperature not below the eutectic temperature of about 577° C., thus forming a supersaturated hypereutectic aluminum-silicon solution and causing silicon platelets to precipitate therefrom.

11. The product of claim 10 in which said partially purified platelets are contacted with said silica slag at a temperature of from about 1410° C. to about 2000° C., said slag having an Si/O ratio of between about ¼ and about ½, said slag being employed in an amount within the range of from about 8% to about 12% by weight based on the weight of silicon platelets melted in contact therewith.

12. The product of claim 11 in which said slag is of high purity, the concentration of each impurity in the slag reducible by molten silica at the silicon platelet-silica slag contacting temperature being less than about 10 ppm.

13. The product of claim 8 and including electrical contacts affixed to said n-type layer and to said substrate, said product constituting a solar cell with said contacts serving to control the flow of electricity produced by the photovoltaic effect upon absorption of sunlight by said solar cell.

14. The product of claim 11 and incouding electrical contacts affixed to said n-type layer and to said substrate, said product constituting a solar cell with said contacts serving to control the flow of electricity produced by the photovoltaic effect upon absorption of sunlight by said solar cell.

15. The product of claim 8 and including (a) melting said directionally solidified refined metallurgical silicon and (b) pulling refined metallurgical silicon boules from the melt of said directionally solidified silicon on a rotating silicon seed rod.

16. The product of claim 15 in which said liquid metal solvent is aluminum or an aluminum alloy.

17. The product of claim 16 in which the removing of silicon platelets from solution comprises cooling the liquid solution of silicon in molten aluminum to a temperature not below the eutectic temperature of about 577° C., thus forming a supersaturated hypereutectic aluminum-silicon solution and causing silicon platelets to precipitate therefrom.

18. The product of claim 17 in which said partially purified platelets are contacted with said silica slag at a temperature of from about 1410° C. to about 2000° C., said slag having an Si/O ratio of between about ¼ and about ½, said slag being employed in an amount within the range of from about 8% to about 12% by weight based on the weight of silicon platelets melted in contact therewith.

19. The product of claim 18 and including electrical contacts affixed to said n-type layer and to said substrate, said product constituting a solar cell with said contacts serving to control the flow of electricity produced by the photovoltaic effect upon absorption of sunlight by said solar cell.

20. The product of claim 15 and including electrical contacts affixed to said n-type layer and to said substrate, said product constituting a solar cell with said contacts serving to control the flow of electricity produced by the photovoltaic effect upon absorption of sunlight by said solar cell.

21. A low-cost, single crystal, epitaxial n-on-p-on-p substrate planar diode comprising p-and-n-type epitaxial layers grown on a passive, p-type, single crystal silicon substrate, said layers duplicating the underlying substrate grain structure, said silicon substrate having been produced by the process comprising a. removing silicon platelets from a solution of metallurgical grade silicon on a liquid metal solvent, thereby recovering partially purified, essentially iron-free silicon platelets with adherent impurities derived from said metal solvent;

b. melting said partially purified silicon platelets in contact with acid silica slag in a melting zone, the resulting slag oxidation removing residual and adherent impurities from said silicon;

c. removing the silicon-slag melt from said melting zone so as to directionally solidify said silicon, said directional solidification resulting in the obtaining of solidified refined metallurgical silicon and a region of solidified melt having a high concentration of impurities rejected by said silicon;

d. re-melting the directionally solidified refined metallurgical silicon after the separation thereof from said region of solidified melt, and removing the resulting silicon melt from the melting zone so as to directionally solidify said silicon a second time, said directional solidification resulting in the obtaining of a solidified, refined metallurgical silicon and a region of solidified melt having a high concentratic of the remaining impurities;

e. melting said directionally solidified refined metallurgical silicon of enhanced purity; and f. pulling silicon boules from said melt on a rotating seed rod, whereby said substrate is produced at a substantially higher impurity level than in conventional high purity semiconductor grade silicon while the resulting low-cost diode has desirable solar cell properties.

22. The product of claim 21 in which said liquid metal solvent is aluminum or an aluminum alloy.

23. The product of claim 22 in which the removing of silicon platelets from solution comprises cooling the liquid solution of silicon in molten aluminum to a temperature not below the eutectic temperature of about 577° C., thus forming a supersaturated hypereutectic aluminum-silicon solution and causing silicon platelets to precipitate therefrom.

24. The product of claim 23 in which said partially purified platelets are contacted with said silica slag at a temperature of from about 1410° C. to about 2000° C., said slag having an Si/O ratio of between about ¼ and about ½, said slag being employed in an amount within the range of from about 8% to about 12% by weight based on the weight of silicon platelets melted in contact therewith.

25. The product of claim 24 and including electrical contacts affixed to said n-type layer and to said substrate, said product constituting a solar cell with said contacts serving to control the flow of electricity produced by the photovoltaic effect upon absorption of sunlight by said solar cell.

26. The product of claim 21 and including electrical contacts affixed to said substrate, the product constituting a solar cell with said contacts serving to control the flow of electricity produced by the photovoltaic effect upon absorption of sunlight by said solar cell.

27. A low-cost, multigrained, epitaxial n-on-p-on-p substrate solar cell comprising p-and-n-type epitaxial layers grown on a passive p-type, multigrained silicon substrate, with electrical contacts affixed to said n-type layer and to said substrate, said substrate comprising a multigrained, refined metallurgical silicon having a resistivity of from about 0.04 to about 0.2 ohm-cm, said silicon having impurity concentrations of up to, but not exceeding, about 1 ppm of aluminum, about 1 ppm of iron, about 0.5 ppm of titanium, about 2 ppm of boron, about 2 ppm of phosphorus, about 0.5 ppm of chromium, about 0.5 ppm of calcium and about 0.5 ppm of magnesium.

28. A low-cost, multigrained epitaxial n-on-p-on-p substrate solar cell comprising p-and n-type epitaxial layers grown on a passive p-type, multigrained silicon substrate, with electrical contacts affixed to said n-type layer and to said substrate, said substrate comprising a multigrained, directionally solidified refined metallurgical silicon having a resistivity of from about 0.04 to about 0.2 ohm-cm, said silicon having impurity concentrations of up to, but not exceeding, about 1 ppm of aluminum, about 1 ppm of iron, about 2 ppm of titanium, about 2 ppm of boron, about 2 ppm of phosphorus, about 1 ppm of chromium, about 1 ppm of calcium, and about 1 ppm of magnesium.

29. A low-cost, multigrained, epitaxial n-on-p-on-p substrate solar cell comprising p-and n-type epitaxial layers grown on a passive p-type, multigrained silicon substrate, with electrical contacts affixed to said n-type layer and to said substrate, said substrate comprising a multigrained, pulled, directionally solidified, refined metallurgical silicon having a resistivity of from about 0.04 to about 0.2 ohm-cm, said silicon having impurity concentrations of up to, but not exceeding about 0.2 ppm of aluminum, about 0.15 ppm of iron, about 0.03 ppm of titanium, about 1.5 ppm of boron, about 0.2 ppm of phosphorus, about 0.02 ppm of chromium, about 0.7 ppm of calcium, about 0.05 ppm of magnesium.

30. A low-cost, single crystal, epitaxial n-on-p-on-p substrate solar cell comprising p-and-n-type epitaxial layers grown on a passive, p-type, single crystal silicon substrate, with electrical contacts affixed to said n-type layer and to said substrate, said substrate comprising a single crystal, pulled, directionally solidified, refined metallurgical silicon having a resistivity of from about 0.05 to about 0.2 ohm-cm, said silicon having impurity concentrations of up to, but not exceeding about 0.2 ppm of aluminum, about 0.15 ppm of iron, about 0.02 ppm of titanium, about 1.5 ppm of boron, about 0.15 ppm of phosphorus, about 0.01 ppm of chromium, about 0.7 ppm of calcium, about 0.17 ppm of magnesium.

31. A low-cost, planar diode having desirable solar cell applications, comprising a p-type multigrained silicon substrate having pentavalent n-type impurities diffused into one side of the substrate to form a p-n junction therein, said silicon substrate having been produced by the process comprising:
   a. removing silicon platelets from a solution of metallurgical grade silicon in a liquid metal solvent, thereby recovering partially purified, essentially iron-free silicon platelets with adherent impurities derived from said metal solvent;
   b. melting said partially purified silicon platelets in contact with acid silica slag in a melting zone, the resulting slag oxidation removing residual and adherent impurities from said silicon; and
   c. pulling refined metallurgical silicon boules from a melt of the thus-refined silicon on a rotating silicon seed rod,
whereby said substrate is produced at a substantially higher impurity level than in conventional high purity semiconductor grade silicon while the resulting low-cost diode has desirable solar cell properties.

32. The product of claim 31 in which said liquid metal solvent is aluminum or an aluminum alloy.

33. The product of claim 32 in which the removing of silicon platelets from solution comprises cooling the liquid solution of silicon in molten aluminum to a temperature not below the eutectic temperature of about 577° C., thus forming a supersaturated hypereutectic aluminum-silicon solution and causing silicon platelets to precipitate therefrom.

34. The product of claim 33 in which said partially purified platelets are contacted with said silica slag at a temperature of from about 1410° C. to about 2000° C., said slag having an Si/O ratio of between about ¼ and about ½, said slag being employed in an amount within the range of from about 8% to about 12% by weight based on the weight of silicon platelets melted in contact therewith.

35. The product of claim 34 and including electrical contacts affixed to the sides of said substrate, said product thereby constituting a solar cell, said contacts serving to control the flow of electricity produced by the photovoltaic effect upon absorption of sunlight by said solar cell.

36. The product of claim 31 and including electrical contacts affixed to the sides of said substrate, said product thereby constituting a solar cell, said contacts serving to control the flow of electricity produced by the photovoltaic effect upon absorption of sunlight by said solar cell.

37. A low-cost, planar diode having desirable solar cell applications, comprising a p-type multigrained silicon substrate having pentavalent n-type impurities diffused into one side of the substrate to form a p-n junction therein, said silicon substrate having been produced by the process comprising:
   a. removing silicon platelets from a solution of said metallurgical grade silicon in a liquid metal solvent, thereby recovering partially purified, essentially iron-free silicon platelets with adherent impurities derived from said metal solvent;
   b. melting said partially purified silicon platelets in contact with acid silica slag in a melting zone, the resulting slag oxidation removing residual and adherent impurities from the silicon platelets; and
   c. removing the silicon-slag melt from said melting zone in a unidirectional manner so as to directionally solidify said silicon, said directional solidification resulting in the obtaining of solidified refined metallurgical silicon and a region of solidified melt having a high concentration of impurities rejected by the refined metallurgical silicon as it solidifies,
whereby said substrate is produced at a substantially higher impurity level than in conventional high purity semiconductor grade silicon while the resulting low-cost diode has desirable solar cell properties.

38. The product of claim 37 in which said liquid metal solvent is aluminum or an aluminum alloy.

39. The product of claim 38 in which the removing of silicon platelets from solution comprises cooling the liquid solution of silicon in molten aluminum to a temperature not below the eutectic temperature of about 577° C., thus forming a supersaturated hypereutectic aluminum-silicon solution and causing silicon platelets to precipitate therefrom.

40. The product of claim 39 in which said partially purified platelets are contacted with said silica slag at a temperature of from about 1410° C. to about 2000° C., said slag having an Si/O ratio of between about ¼ and about ½, said slag being employed in an amount within the range of from about 8% to about 12% by weight based on the weight of silicon platelets melted in contact therewith.

41. The product of claim 40 and including electrical contacts affixed to the sides of said substrate, the product thereby constituting a solar cell, said contacts serving to control the flow of electricity produced by the photovoltaic effect upon absorption of sunlight by said solar cell.

42. The product of claim 37 and including electrical contacts affixed to the sides of said substrate, said product thereby constituting a solar cell, said contacts serving to control the flow of electricity produced by the photovoltaic effect upon absorption of sunlight by said solar cell.

43. The product of claim 37 and including (a) melting said directionally solidified refined metallurgical silicon and (b) pulling refined metallurgical silicon boules from the melt of said directionally solidified silicon on a rotating silicon rod.

44. The product of claim 43 in which said liquid metal solvent is aluminum or an aluminum alloy.

45. The product of claim 44 in which the removing of silicon platelets from solution comprises cooling the liquid solution of silicon in molten aluminum to a temperature not below the eutectic temperature of about 577° C., thus forming a supersaturated hypereutectic aluminum-silicon solution and causing silicon platelets to precipitate therefrom.

46. The product of claim 45 in which said partially purified platelets are contacted with said silica slag at a temperature of from about 1410° C. to about 2000° C., said slag having an Si/O ratio of between about ¼ and about ½, said slag being employed in an amount within the range of from about 8% to about 12% by weight based on the weight of silicon platelets melted in contact therewith.

47. The product of claim 46 and including electrical contacts affixed to the sides of said substrate.

48. The product of claim 43 and including electrical contacts affixed to the sides of said substrate, the product thereby constituting a solar cell, said contacts serving to control the flow of electricity produced by the photovoltaic effect upon absorption of sunlight by said solar cell.

49. A low-cost, single crystal planar diode having desirable solar cell applications comprising a p-type single crystal silicon substrate having pentavalent n-type impurities diffused into one side of the substrate to form a p-n junction therein, said silicon substrate having been produced by the process comprising:
   a. removing silicon platelets from a solution of metallurgical grade silicon in a liquid metal solvent, thereby recovering partially purified, essentially iron-free silicon platelets with adherent impurities derived from said metal solvent;
   b. melting said partially purified silicon platelets in contact with acid silica slag in a melting zone, the resulting slag oxidation removing residual and adherent impurities from said silicon;
   c. removing the silicon-slag melt from said melting zone so as to directionally solidify said silicon, said directional solidification resulting in the obtaining of solidified refined metallurgical silicon and a region of solidified melt having a high concentration of impurities rejected by said silicon;
   d. re-melting the directionally solidified refined metallurgical silicon after the separation thereof from said region of solidified melt, and removing the resulting silicon melt from the melting zone so as to directionally solidify said silicon a second time, said directional solidification resulting in the obtaining of a solidified, refined metallurgical silicon and a region of solidified melt having a high concentration of the remaining impurities;
   e. melting said directionally solidified refined metallurgical silicon of enhanced purity; and
   f. pulling silicon boules from said melt on a rotating seed rod,
whereby said substrate is produced at a substantially higher impurity level than in conventional high purity semiconductor grade silicon while the resulting low-cost diode has desirable solar cell properties.

50. The product of claim 49 in which said liquid metal solvent is aluminum or an aluminum alloy.

51. The product of claim 50 in which the removing of silicon platelets from solution comprises cooling the liquid solution of silicon in molten aluminum to a temperature not below the eutectic temperature of 577° C., thus forming a supersaturated hypereutectic aluminum-silicon solution and causing silicon platelets to precipitate therefrom.

52. The product of claim 51 in which said partially purified platelets are contacted with said silica slag at a temperature of from about 1410° C. to about 2000° C., said slag having an Si/O ratio of between about ¼ and about ½, said slag being employed in an amount within the range of from about 8% to about 12% by weight based on the weight of silicon platelets melted in contact therewith.

53. The product of claim 52 and including electrical contacts affixed to the sides of said substrate.

54. The product of claim 49 and including electrical contacts affixed to the sides of said substrate, the product constituting a solar cell with said contacts serving to control the flow of electricity produced by the photovoltaic effect upon absorption of sunlight by said solar cell.

55. A low-cost solar cell comprising a p-type multigrained silicon substrate having pentavalent n-type impurities diffused into one side of the substrate to form a p-n junction therein, with electrical contacts affixed to the sides of said substrate, said substrate comprising a multigrained, refined metallurgical silicon having a resistivity of from about 0.04 to about 0.2 ohm-cm, said silicon having impurity concentrations of up to, but not exceeding, about 1 ppm of aluminum, about 1 ppm of iron, about 0.5 ppm of titanium, about 2 ppm of boron, about 2 ppm of phosphorus, about 0.5 ppm of chromium, about 0.5 ppm of calcium, and about 0.5 ppm of magnesium.

56. A low-cost solar cell comprising a p-type multigrained silicon substrate having pentavalent n-type impurities diffused into one side of the substrate to form a p-n junction therein, with electrical contacts affixed to the sides of said substrate, said substrate comprising a multigrained, directionally solidified refined metallurgical silicon having a resistivity of from about 0.04 to about 0.2 ohm-cm, said silicon having impurity concentrations of up to, but not exceeding, about 1 ppm of aluminum, about 1 ppm of iron, about 2 ppm of titanium, about 2 ppm of boron, about 2 ppm of phosphorus, about 1 ppm of chromium, about 1 ppm of calcium, and about 1 ppm of magnesium.

57. A low-cost solar cell comprising a p-type multigrained silicon substrate having pentavalent n-type impurities diffused into one side of the substrate to form a p-n junction therein, with electrical contacts affixed to the sides of said substrte, said substrate comprising a multigrained, pulled directionally solidified refined metallurgical silicon having a resistivity of from about 0.04 to about 0.2 ohm-cm, said silicon having impurity concentrations of up to, but not exceeding, about 0.2 ppm of aluminum, about 0.15 ppm of iron, about 0.03 ppm of titanium, about 1.5 ppm of boron, about 0.2 ppm of phosphorus, about 0.02 ppm of chromium, about 0.7 ppm of calcium, and about 0.05 ppm of magnesium.

58. A low cost solar cell comprising a p-type single crystal silicon substrate having pentavalent n-type impurities diffused into one side of the substrate to form a p-n junction therein, with electrical contacts affixed to the sides of said substrate, said substrate comprising a single crystal, pulled, directionally solidified, refined metallurgical silicon having a resistivity of from about 0.04 to about 0.2 ohm-cm, said silicon having impurity concentrations up to, but not exceeding, about 0.2 ppm of aluminum, about 0.15 ppm of iron, about 0.02 ppm of titanium, about 1.5 ppm of boron, about 0.15 ppm of phosphorus, about 0.01 ppm of chromium, about 0.7 ppm of calcium, and about 0.17 ppm of magnesium.

* * * * *